United States Patent [19]

Tardy

[11] Patent Number: 4,538,771
[45] Date of Patent: Sep. 3, 1985

[54] APPARATUS FOR TESTING THE INTEGRITY OF AN ELECTRICAL COIL AS IT IS WOUND

[75] Inventor: John Tardy, Somerville, N.J.

[73] Assignee: AT&T Technologies, Inc., Berkeley Heights, N.J.

[21] Appl. No.: 540,942

[22] Filed: Oct. 11, 1983

Related U.S. Application Data

[62] Division of Ser. No. 267,980, May 28, 1981, Pat. No. 4,416,057.

[51] Int. Cl.³ .............................................. H01F 41/06
[52] U.S. Cl. ...................................... 242/7.12; 324/51
[58] Field of Search .................. 242/7.12; 29/605, 593; 324/51, 52, 54

[56] References Cited

U.S. PATENT DOCUMENTS

| | | | |
|---|---|---|---|
| 556,646 | 3/1896 | Scott et al. | 324/51 |
| 1,743,318 | 1/1930 | Carrington | 324/52 |
| 2,432,948 | 12/1947 | Thompson | 324/52 |
| 2,643,285 | 6/1953 | Cranford | 324/51 |
| 3,022,019 | 2/1962 | Simpson et al. | 242/7.12 |
| 3,031,153 | 4/1962 | Attwood et al. | 242/7.12 |
| 3,562,902 | 2/1971 | Green | 29/593 |
| 3,861,025 | 1/1975 | Sims | 29/593 |
| 3,875,511 | 4/1975 | Sims | 324/158 MG |
| 3,970,924 | 7/1976 | Pendleton et al. | 324/54 |

OTHER PUBLICATIONS

Schump, D. E. et al., "Winding Fault Diagnosis by Surge Comparison", 14th Electrical/Electronics Insulation Conference.

Baker Instrument Company, "Surge Comparison Winding Testers".

Shook, G. L. et al., "Surge Testing of Traction Motor Armatures", 14th Electrical/Electronics Insulation Conference.

Primary Examiner—Billy S. Taylor
Attorney, Agent, or Firm—W. O. Schellin; G. W. Houseweart

[57] ABSTRACT

In the manufacture of electrical coils (10), particularly large transformer coils, an insulated wire (11) is wound on a rotatable winding arbor (12) so as to form a succession of turns of the insulated wire. Particularly when large gauge enamelled copper wire is wound, the insulation (14) has a tendency to crack or chip during the winding process, causing shorted turns and producing a defective coil. This disclosure relates to systems for testing such a coil to detect a short as it is wound so as to permit interruption of the winding process and repair of the insulation fault on the spot. The test equipment includes a pair of test windings (41, 42) positioned at opposite ends of the winding arbor (12) and magnetically coupled by flux paths (50, 51) to each other and to the coil being wound so that an A.C. input signal ($V_1$) applied to the first winding (41) induces an A.C. output signal ($V_2$) in the second winding (42) that undergoes a characteristic change, such as a voltage drop, when a short occurs. A detecting circuit (60) senses such a change in the output signal and provides an output (63) when a shorted turn is detected. Preferably, a parallel shunt return path (70) is provided between the arbor and the machine frame so as to increase the sensitivity of the detector circuit.

19 Claims, 7 Drawing Figures

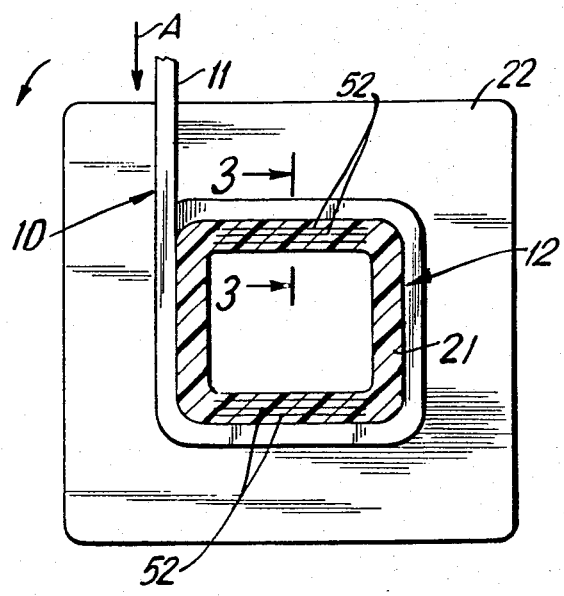
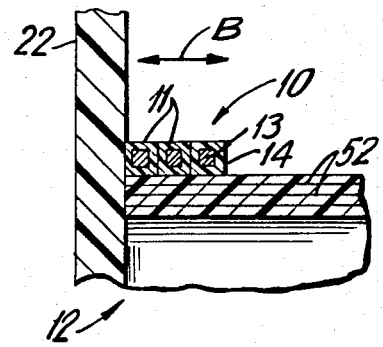
FIG.2
FIG.3
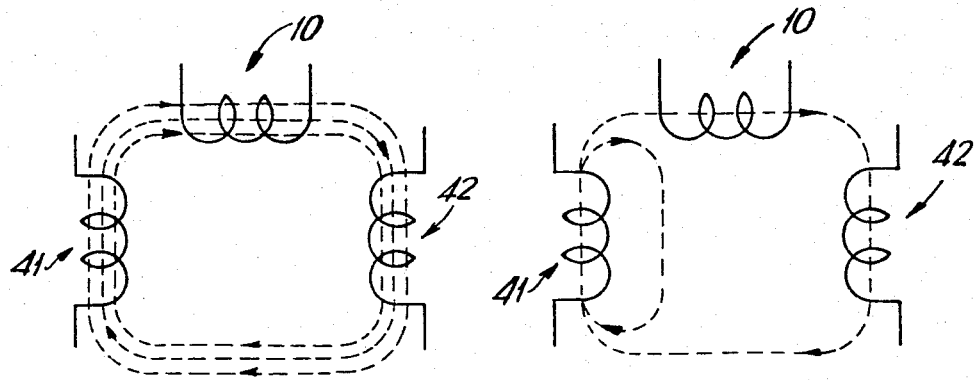
FIG.4
FIG.5

APPARATUS FOR TESTING THE INTEGRITY OF AN ELECTRICAL COIL AS IT IS WOUND

This is a division application Ser. No. 267,980 filed May 28, 1981, now U.S. Pat. No. 4,416,057.

TECHNICAL FIELD

This invention relates generally to apparatus for testing the integrity of an electrical coil including turns of an insulated wire being wound on a core member, and particularly for detecting shorted turns as the coil is wound so as to permit interruption of the winding operation and immediate repair of the fault on the spot, prior to resumption of the winding operation.

BACKGROUND OF THE INVENTION

In the manufacture of electrical coils, particularly large inductance coils or transformer windings involving relatively large gauge enamelled copper wire or rod, the coil is wound under tension on a winding arbor and the enamel insulation, being somewhat frangible, has a tendency to chip or crack on occasion as the relatively stiff copper wire is wound, thus forming shorted turns. In most cases, such shorts are not detectable by visual inspection, so that a short is not detected until after the coil has been fully wound, finished, and late subjected to an electrical acceptance test. In such cases, it is too late to repair the coil easily, as the short is then covered and difficult to locate.

SUMMARY OF THE INVENTION

A specific object of the invention is to provide apparatus for testing such large coils of insulated wire to detect a shorted turn as it is wound, so as to permit interruption of the winding operation and immediate repair of the insulation fault.

More general objects are to provide apparatus for testing the integrity of an electrical coil including turns of an insulated wire being wound on a core member, and particularly for detecting shorts in such a coil as it is wound. In accordance with certain features of the invention, an A.C. input singal is applied to a first test winding positioned opposite to one end of the coil being wound and magnetically coupled to that coil. A second test winding is positioned opposite to the other end of the coil being wound and is magnetically coupled to the first winding and to the coil so that an A.C. output signal is induced in the second winding having a first electrical characteristic when the turns of the coil being wound are not shorted and having a different characteristic when a short occurs. With this arrangement, changes in the output characteristic are detected to provide an indication that the turns being wound are shorted.

Preferably, the winding operation is interrupted in response to a detected short and the fault in the insulation is repaired prior to resumption to the winding operation. In one example, the test windings are connected to an A.C. bridge detector circuit including a differential voltmeter arranged to provide a normal, steady-state voltage output, typically zero volts, when the coil being wound is continuous (no shorts). When a short occurs, currents are induced by the magnetic flux in the coupling path through the equipment. The magnetizing force associated with this current will cause some of the flux lines to diverge from the normal path that couples the test windings and the coil being wound. This results in a sudden drop in the output voltage induced in the second winding, which change is sensed by the voltmeter or other detecting device to provide an output that can be used to activate an alarm and preferably is used to stop the winding motor to permit immediate repair of the short.

Other objects, advantages and features of the invention will appear from the following detailed description of a specific embodiment thereof, when read in conjunction with the accompanying drawings.

BRIEF DESCRIPTION OF THE DRAWINGS

FIG. 2 is a transverse vertical section along line 2—2 of FIG. 1, illustrating a portion of the winding apparatus.

FIG. 3 is a fragmentary vertical section along line 3—3 of FIG. 2, illustrating adjacent turns of insulated wire being wound on a core member.

FIG. 4 is a circuit diagram illustrating flux paths with no electrical short in coil 10.

FIG. 5 is a circuit diagram illustrating flux paths with an electrical short in coil 10.

DETAILED DESCRIPTION

Winding Process

Figure 1:
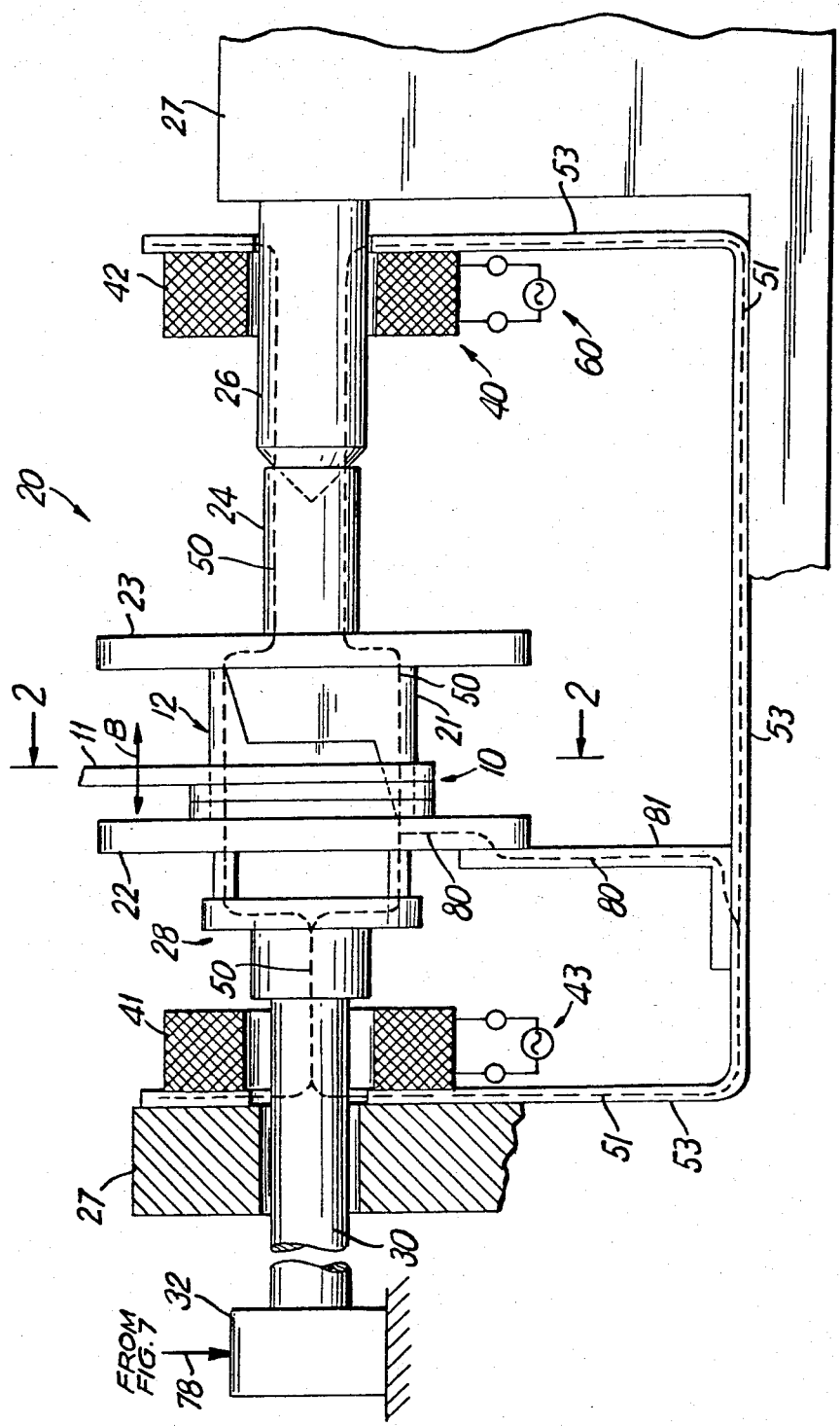
FIG. 1 is a vertical section of a coil winding machine, including a pair of test windings and magnetic coupling arrangements for detecting shorts in accordance with one specific embodiment of the invention.

Referring now in detail to the drawings and particularly to FIGS. 1-3, methods and apparatus in accordance with one specific embodiment of the invention are illustrated for testing the integrity of an electrical coil 10 including a plurality of turns of an insulated wire 11 that are wound on a central core member, such as a conventional winding arbor 12. In particular, the invention relates to on-the-fly testing to detect a shorted turn as the coil 10 is being wound, so as to permit interruption of the winding operation and immediate repair of the short on the spot, following which the winding operation is resumed.

In a specific example illustrated, the coil 10 comprises a relatively large, substantially rectangular transformer winding including a number of turns of a relatively large gauge enamelled copper rod or wire 11 (for example, thirteen gauge or larger) consisting of a rectangular cross section copper rod 13 (FIG. 3) coated with a conventional enamel insulation 14 such as polyvinyl formal or polyester enamel (Anatherm by Anaconda). In this example, the insulation is somewhat frangible and has a tendency to crack or chip on occasion as the relatively stiff copper rod is wound under tension on the arbor 12, thus forming shorted turns. In such an operation, an insulation fault causing a short is usually fairly small and hidden from view, so that the short cannot be detected visually. Thus, the fault is not detected until the coil 10 has been fully wound, removed from the arbor 12, finished, and later subjected to an electrical acceptance test.

Of course, it is difficult or impossible to locate and attempt repair of such a short after the coil has been fully wound, particularly with heavy gauge copper wire which assumes a permanent set during the coil-winding operation. As previously mentioned, this application relates particularly to methods and apparatus for testing such a coil as it is being wound and for immediate detection of such a shorted turn as wound, so that the winding operation can be interrupted at that point and the short repaired. Prior to describing the testing apparatus in detail, a generally conventional winding machine 20 will first be described as background.

Referring to FIGS. 1–3, the winding machine 20 includes a collapsible winding arbor 12 having a rectangular central core 21 on which the insulated wire 11 is wound and a pair of enlarged faceplates 22 and 23 that are fastened to the ends of the core 21 so as to define an annular winding area on the arbor between the faceplates 22–23. The faceplate 23 at the right in FIG. 1 includes a cylindrical sleeve 24 extending axially outward therefrom to the right and rotatably mounted on a fixed steel tailstock 26 at the right, so as to permit rotation of the arbor 12 within the winding machine 20. The tailstock 26 is mounted on a machine frame 27 in generally conventional fashion.

The faceplate 22 at the left is formed with a hub 28 adapted to be rotated through conventional gearing (not shown) by a steel drive shaft 30 that extends into the hub 28 and is driven by a suitable winding motor 32 to rotate the arbor 12. In a typical example, the arbor 12 is rotated at a speed in the range of 10–300 RPM to wind the insulated wire 11 on the arbor 12 until a predetermined number of turns have been wound. The wire 11 is advanced under tension to the arbor 12 as indicated by arrow A in FIG. 2, and is distributed laterally along the winding surface of the arbor 12 (arrow B in FIG. 3) either manually or by a conventional distributor mechanism (not shown). In this example, when the coil 10 has been fully wound, an insulating tape is applied to hold the turns securely in place, the arbor 12 is detached from the machine 20, and the arbor is then disassembled by removing one or both of the faceplates 22 or 23 so that the coil 10 can be slipped off the arbor core 21 to provide a self-supporting coil 10 of the wire 11.

Testing System

Figure 6:
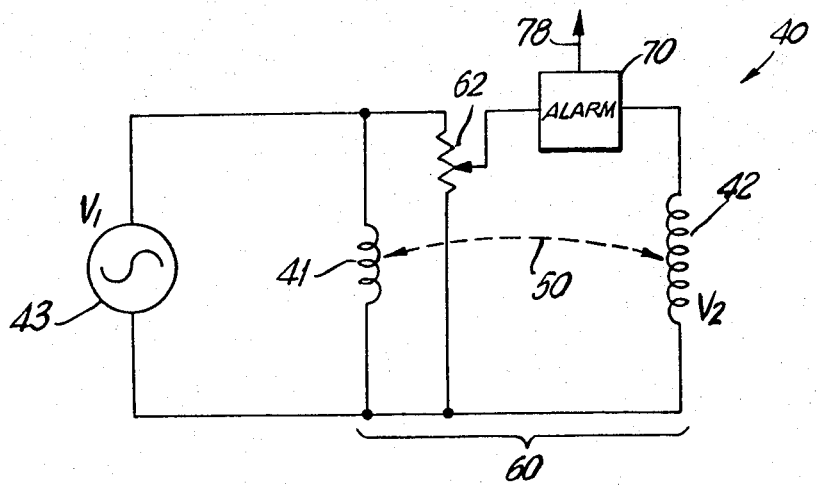
FIG. 6 is a circuit diagram of a testing circuit in accordance with a specific embodiment of the invention.

Referring now to FIGS. 1 and 6, there is illustrated a testing apparatus 40 in accordance with one specific embodiment of the invention, for detecting a short in such a coil 10 as the coil is wound, so that the winding process can be interrupted at that point and the fault repaired on the spot before the winding operation is resumed. Such a short is repaired by stopping and reversing the drive motor 32 to unwind a short segment of the wire 11 at the fault location until the indication of a short ceases, visually locating the fault in the insulation such as as chip or crack, and then repairing the fault by applying insulating dope to the wire 11 at that point. Then, the winding operation is resumed and the testing apparatus 40 indicates that the repair operation was successfully accomplished.

In the embodiment illustrated in FIGS. 1 and 6, the test apparatus 40 includes a first or input test winding 41 mounted coaxially adjacent to one end of the arbor 12 (the left end in FIG. 1) and magnetically coupled to the coil being wound, and a second or output test winding 42 mounted coaxially opposite to the other end of the arbor 12 and magnetically coupled to the input winding 41 and to the coil 10 being wound. The input winding 41 is connected to an A.C. source 43 for applying an A.C. input signal $V_1$ to the first winding 41, which induces an A.C. output signal $V_2$ in the second or pickup winding 41 normally having a first electrical characteristic when the turns being wound are not shorted and having a different characteristic when a short occurs. In the specific embodiment illustrated, the output voltage $V_2$ induced in the pickup coil 42 assumes a nominal steady-state value when the coil 10 is not shorted and then suddenly drops when a short occurs, and the test set 40 detects such a characteristic change in voltage to provide an indication that the turns being wound are shorted as discussed hereafter with respect to FIG. 4.

In the example illustrated in FIG. 1, the magnetic flux path coupling the test windings 41–42 to each other and to the coil 10 being wound is indicated by dotted lines 50–50 and extends through the winding apparatus 20 from the input winding 41 to the coil 10 being wound and on the pickup winding 42, then returns to the input winding 41 as indicated by the dotted line 51 at the bottom of FIG. 1. For this purpose, portions of the winding apparatus 20 between the windings 41 and 42 are fabricated of ferromagnetic or other magnetically permeable material to provide the required flux path 50 between the windings. In the embodiment illustrated, the drive shaft 30 and the tailstock 26 are made of steel and, while it would be possible to fabricate the winding arbor 12 of steel or other permeable material, it is preferred to use a molded plastic arbor 12 having magnetically permeable material incorporated or embedded therein so as to provide a flux coupling path 50 through the arbor 12 from one end to the other. It is preferred to have arbor 12 made of plastic or some other insulating material to prevent the formation of parasitic magnetic eddy currents in the arbor.

In order to provide the required magnetic flux path through a predominantly insulating arbor 12, the arbor is molded with a plurality of ferromagnetic laminations 52–52 (FIGS. 2–3) embedded in the plastic and extending laterally along the arbor parallel to the axis of rotation to provide the required flux path 50 through the arbor from one end to the other. In a typical example, the laminations 52 used are steel transformer laminations having a width of $\frac{1}{8}''$ to $\frac{1}{4}''$ and a thickness of about 0.014'' (approximately 3 to 6 mm $\times$ 0.35 mm), the laminations being cut to length to span the flux path region in question. As illustrated, the laminations 52–52 span the length of the arbor core 21 from left to right in FIG. 1 and extend along a portion of the faceplate 23 and sleeve 24 at the right to establish a continuous flux path 50 through the arbor 12 from the steel drive shaft 30 at the left to the steel tailstock 26 at the right. From the output winding 42 at the right, the flux return path 51 from the output winding 42 back to the input winding 41 is established through a U-shaped steel plate 53 mounted inside the machine frame 27 as illustrated between the windings 41 and 42. Alternatively, the machine frame 27 could be used to provide the return path 51 if made of permeable material.

Preferably, the input and output windings 41 and 42 are fixedly mounted to the machine frame 27 as illustrated, adjacent to the outer ends of the winding arbor 12. This arrangement is useful in simplifying the circuit connections to the test set 40. Since the windings 41 and 42 thus do not rotate with the arbor 12, there is no need to provide circuit connections to rotating components.

With this arrangement, as the coil 10 is wound, the A.C. input signal $V_1$ applied to the first winding 41 induces a corresponding output signal $V_2$ in the pickup winding 42 as indicated in FIG. 4 due to the magnetic flux path 50-51 as described above coupling the windings 41-42 to each other and to the coil 10 being wound. If the coil 10 being wound has no shorted turns, the output voltage $V_2$ has a nominal steady-state value such as approximately one volt in a typical example based on an A.C. input voltage $V_1$ of approximately ten volts at 60 Hz. FIG. 4 illustrates coil 10 being magnetically coupled to windings 41 and 42 by magnetic flux (dotted lines) induced by voltage $V_1$ at winding 41 when coil 10 has no shorted turns.

In this example, when a short occurs between any two turns in the coil 10 being wound, the magnetic flux path is disrupted and eddy currents are set up in the shorted turns causing some of the flux lines to diverge from the normal path that couples all three windings 41-10-42 as is illustrated in FIG. 5. This process generates opposing flux resulting in a reduction of the normal rate of change of the magnetic flux in the arbor 12, thus diverting portions of the flux from the output winding 42 and resulting in a lower induced voltage $V_2$ in the winding 42, such from about one volt to about 0.95 to 0.5 volts in a typical example of the process, depending on the circuit parameters and the size of the fault.

Referring now to FIG. 6, there is illustrated a specific example of a test set 40 in accordance with one specific embodiment of the invention, including an A.C. bridge detector circuit 60 for detecting deviations in the characteristics of the output signal induced in the output winding 42, in this embodiment for sensing a characteristic drop in the output voltage $V_2$ when a short occurs. In this embodiment, the input winding 41 and the pickup winding 42 are connected in the bridge circuit 60 as shown, with a potentiometer 62 that is adjusted to compensate for normal losses between the two windings 41 and 42 so that voltage alarm circuit 70 normally provides no output signal when the coil 10 being wound is continuous. When a discontinuity occurs, a sudden drop in the pickup voltage $V_2$ is experienced, which causes alarm circuit 70 to operate a warning device such as a buzzer or a light in any conventional fashion and preferably to stop the drive motor 32 for the winding operation to permit repair of the fault as described above.

Figure 7:
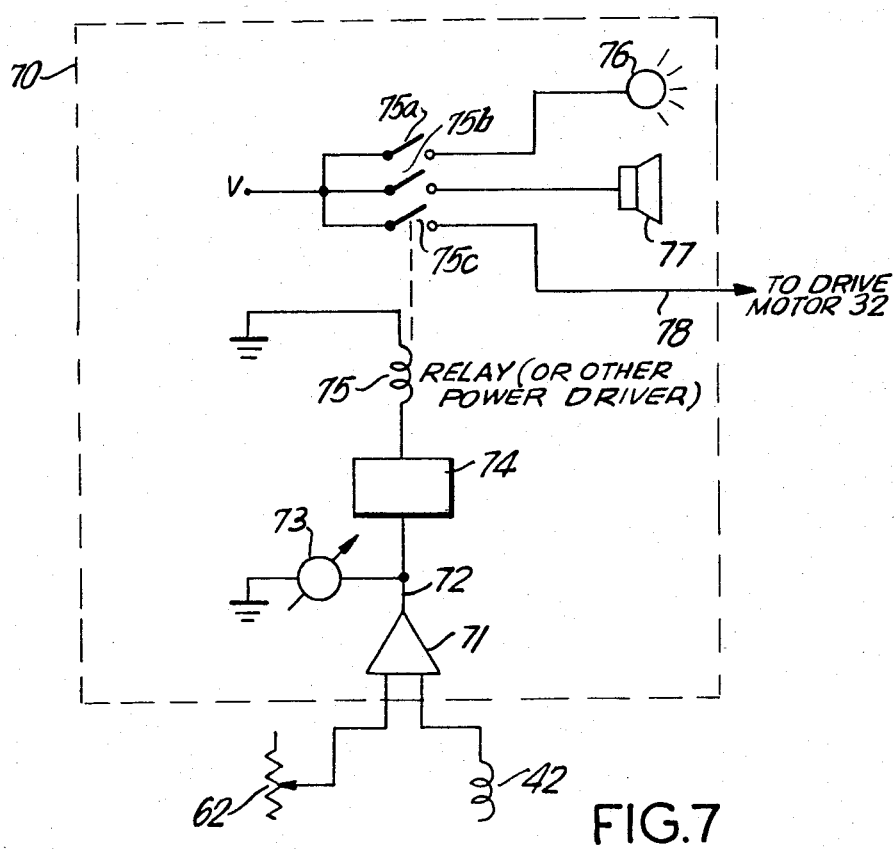
FIG. 7 is a circuit diagram of an alarm circuit which operates in conjunction with the testing circuit of FIG. 6.

In practice, the components of bridge detection circuit 60 and alarm circuit 70 are assembled as illustrated in FIGS. 6 and 7 with potentiometer 62 set so that buffer comparator amplifier 71 of alarm circuit 70 provides a zero output on lead 72 during winding of a good coil. Buffer amplifier 71 is continually comparing the voltage signals appearing at potentiometer 62 and coil 42 respectively and provides an output signal on lead 72 which is proportioned to the amplitude difference between the two compared voltages. Of course, the induced output $V_2$ in the pickup winding 42 varies with the input voltage $V_1$, the magnetic characteristics of the magnetic flux paths 51-52 and 80, and the ratio of turns in the output winding 42 to the input winding 41. In one typical example, these parameters are adjusted using a turns ratio of approximately 1 to 1, to provide a nominal steady-state output voltage $V_2$ of about one volt using an an input voltage $V_1$ of about ten volts as described above.

When a voltage difference occurs between voltages appearing at potentiometer 62 and winding 42, a signal is generated by buffer amplifier 71 on lead 72 which is connected with meter 73 and level detector 74. Meter 73 is provided to give a visual display of the signal appearing on lead 72 while level detector 74 acts as a switch which turns on when the amplitude level of the signal on lead 72 exceeds a certain predetermined value. Detector 74 is included in alarm circuit 70 to prevent the activation of the circuit 70 by any residual signals appearing on lead 72 caused by winding coil 10. A buffer amplifier 71 and a level detector 74 which may be used in this circuit are the 502A buffer amplifier and the 502J level detector, both of which are manufactured by Western Electric Company, Inc. When the signal level on lead 72 exceeds a predetermined level (e.g. 0.1 volts) detector 74 turns on thereby causing relay 75 to operate to close contact points 75a, b, and c to light lamp 76, activate horn 77 and provide a signal on lead 78 to motor 32. Typically this signal on lead 78 would cause motor 32 to halt.

As the motor 32 is thus stopped and then reversed to unwind the wire 11 back to the region of the fault, the detector circuit 60 senses a change in the output signal $V_2$ back to the first characteristic, in this example a reversion to the original steady-state voltage $V_2$ indicating no fault, to provide an indication of the beginning of the fault region to be repaired, after which the unwinding operation is stopped and the fault repaired as described above. After the repair has been completed and the winding operation is resumed from a point prior to the repaired fault, the test set 40 also indicates in the same manner described above whether or not the short still exists, thus providing an indication as to whether or not the repair operation has been successfully completed.

In addition to the magnetic flux paths 50-51 discussed above, it is preferred to provide an additional leakage or a shunt return path 80 that parallels the path 50-51 through the arbor 12 and the steel plate 53. In the example illustrated, a ferromagnetic member such as a steel bracket 81 is mounted to the steel plate 53 at the base of the machine and is provided with an upper surface positioned in close proximity to the outer surface of the rotating faceplate 22 at the left so as to provide the parallel shunt return path indicated by the dotted line 80. While the detection circuit 60 functions without this added shunt return path 80, this added path provides an efficient leakage path in the event a short occurs, thus providing greater sensitivity in the detector circuit 60 and alarm circuit 70.

In view of the foregoing description, it should be apparent that there has been provided a low cost, simple and effective method and apparatus for testing the integrity of an electrical coil of insulated wire as it is wound and for providing an immediate indication of a shorted turn, thus allowing the operator to stop the winding operation and to repair the short on the spot. The testing apparatus 40 is quite simple and utilizes relative low voltage components in the system so as to render the process safe and reliable. While one specific embodiment of the invention has been described in detail above, it should be apparent that various modifications may be made from the specific details described without departing from the spirit and scope of the invention.

What is claimed is:

1. Apparatus for testing the integrity of an electrical coil including turns of an insulated wire being wound on a core member in a winding machine, which comprises:
   a first test winding positioned adjacent to one side of the coil being wound;
   a second test winding positioned adjacent to another side of the coil being wound;

means for applying an A.C. input signal to the first test winding;

means for magnetically coupling the test windings to each other and to the coil being wound, said coupling means including means responsive to the input signal for inducing in the second winding an A.C. output signal having a first voltage characteristic when the turns of the coil being wound are not shorted and having a different voltage characteristic when a short occurs; and means for detecting such a difference in the output signal characteristic to provide an indication that the turns being wound are shorted.

2. Apparatus as recited in claim 1, wherein:

the coupling means includes means sufficient that the output signal has a nominal steady-state voltage when the coil is not shorted and a characteristically different voltage when a short occurs; and the detecting means includes means for sensing such a characteristic change in the output voltage.

3. Apparatus as recited in claim 2, wherein the detecting means comprises an A.C. bridge detector circuit including a differential comparator and means for connecting the first and second test windings to the circuit, said circuit including means for normally providing an output of essentially zero volts when the coil being wound is continuous, and a voltage of a different magnitude when a short occurs.

4. Apparatus for winding an electrical coil of insulated wire and for testing the coil for shorted turns as it is wound, which comprises:

a machine frame;

a rotatable winding arbor;

means for mounting the arbor for rotation in the frame about a longitudinal winding axis;

a drive motor for rotating the arbor so as to wind the insulated wire on winding surface of the arbor in a series of consecutive turns to form the coil;

an input test winding fixedly mounted to the machine frame coaxially adjacent to one end of the arbor;

a pickup test winding fixedly mounted to the machine frame coaxially adjacent to the other end of the arbor;

means for applying an A.C. input signal to the input winding;

means for establishing a magnetic flux path through the arbor and adjacent portions of the winding apparatus, for coupling the windings to each other and to the coil being wound so that the input signal induces an A.C. output signal in the pickup winding having a nominal steady-state voltage when the coil being wound is not shorted and a characteristically lower voltage when a short occurs; and means for sensing a characteristic drop in the output voltage for indicating a short in the coil and for stopping the drive motor when a short is detected so as to permit repair of the fault, following which the winding operation may be resumed.

5. Apparatus as recited in claim 4, further comprising a steel bracket mounted to a steel base plate of the machine frame and having a portion positioned close to the end of the arbor adjacent to the input winding for establishing a parallel shunt return magnetic flux path from that end of the arbor to the input winding.

6. Apparatus as recited in claim 5, wherein the arbor comprises an insulating arbor having a central core member and enlarged faceplates at the ends of the core member, and wherein the arbor contains a plurality of steel laminations embedded in the plastic and constituting the portions of the magnetic flux path extending through the arbor.

7. Apparatus as recited in claim 1, further comprising means for interrupting the coil-winding operation in response to a detected change in the output signal characteristic so that a fault in the insulation causing the short may be repaired, following which the winding operation may be resumed.

8. Apparatus as recited in claim 2, further comprising means for interrupting the coil-winding operation in response to a detected change in the output signal characteristic so that a fault in the insulation causing the short my be repaired, following which the winding operation may be resumed.

9. Apparatus as recited in claim 3, further comprising means for interrupting the coil-winding operation in response to a detected change in the output signal characteristic so that a fault in the insulation causing the short may be repaired, following which the winding operation may be resumed.

10. Apparatus as recited in claim 1, for use in combination with a coil-winding machine of the type including a machine frame, a rotatable winding arbor comprising the core member and rotatably mounted in the machine frame, and a drive motor for rotating the arbor about a winding axis to wind the coil, wherein:

the first and second test windings are fixedly mounted to the machine frame adjacent to the outer ends of the winding arbor and are coaxially mounted with respect to the axis of rotation of the arbor.

11. Apparatus as recited in claim 10, wherein the winding arbor comprises an insulating member having magnetically permeable material embedded in the plastic and extending laterally along the arbor parallel to the axis of rotation of the arbor to provide a magnetic flux path through the arbor from one end to the other constituting a portion of the magnetic coupling means.

12. Apparatus as recited in claim 10, wherein the magnetic coupling means further includes a ferromagnetic member mounted to the machine frame in close proximity to the end of the arbor adjacent to the first test winding and magnetically coupled to the arbor so as to establish a parallel shunt return flux path providing increased sensitivity in the detecting means.

13. Apparatus as recited in claim 2, for use in combination with a coil-winding machine of the type including a machine frame, a rotatable winding arbor comprising the core member and rotatably mounted in the machine frame, and a drive motor for rotating the arbor about a winding axis to wind the coil, wherein:

the first and second test windings are fixedly mounted to the machine frame adjacent to the outer ends of the winding arbor and are coaxially mounted with respect to the axis of rotation of the arbor.

14. Apparatus as recited in claim 13, wherein the winding arbor comprises an insulating member having magnetically permeable material embedded in the plastic and extending laterally along the arbor parallel to the axis of rotation of the arbor to provide a magnetic flux path through the arbor from one end to the other constituting a portion of the magnetic coupling means.

15. Apparatus as recited in claim 13, wherein the magnetic coupling means further includes a ferromagnetic member mounted to the machine frame in closed proximity to the end of the arbor adjacent to the first test winding and magnetically coupled to the arbor so as to establish a parallel shunt return flux path providing increased sensitivity in the detecting means.

16. Apparatus as recited in claim 3, for use in combination with a coil-winding machine of the type including a machine frame, a rotatable winding arbor comprising the core member and rotatably mounted in the machine frame, and a drive motor for rotating the arbor about a winding axis to wind the coil, wherein:

the first and second test windings are fixedly mounted to the machine frame adjacent to the outer ends of the winding arbor and are coaxially mounted with respect to the axis of rotation of the arbor.

17. Apparatus as recited in claim 16, wherein the winding arbor comprises an insulating member having magnetically permeable material embedded in the plastic and extending laterally along the arbor parallel to the axis of rotation of the arbor to provide a magnetic flux path through the arbor from one end to the other constituting a portion of the magnetic coupling means recited in claim 5.

18. Apparatus as recited in claim 16, wherein the magnetic coupling means further includes a ferromagnetic member mounted to the machine frame in close proximity to the end of the arbor adjacent to the first test winding and magnetically coupled to the arbor so as to establish a parallel shunt return flux path providing increased sensitivity in the detecting means.

19. Apparatus for testing the integrity of an electrical coil including turns of an insulated wire being wound on a core member, which comprises:

a first test winding positioned adjacent to one side of the coil being wound;

a second test winding positioned adjacent to the other side of the coil being wound;

means for applying an A.C. input signal to the first test winding;

means for magnetically coupling the test windings to each other and to the coil being wound so that the input signal induces in the second winding an A.C. output signal having a nominal steady-state voltage when the coil is not shorted and a characteristically different voltage when a short occurs; and means for detecting such a characteristic change in the output voltage to provide an indication that the turns being wound are shorted, said detecting means including an A.C. bridge detector circuit including a differential comparator and means for connecting the first and second test windings to the circuit so that the comparator normally provides an output of essentially zero volts when the coil being wound is continuous, and so that a voltage rise is generated at the comparator when a short occurs.

* * * * *